(12) United States Patent
Komori et al.

(10) Patent No.: US 7,759,745 B2
(45) Date of Patent: Jul. 20, 2010

(54) SEMICONDUCTOR MEMORY DEVICE

(75) Inventors: Hideki Komori, Kawasaki (JP); Hisayuki Shimada, Aizuwakamatsu (JP); Yu Sun, Sunnyvale, CA (US); Hiroyuki Kinoshita, Sunnyvale, CA (US)

(73) Assignees: Fujitsu Limited, Kawasaki (JP); Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/656,437

(22) Filed: Jan. 23, 2007

(65) Prior Publication Data
US 2007/0114617 A1 May 24, 2007

Related U.S. Application Data

(63) Continuation of application No. 11/066,567, filed on Feb. 28, 2005, now Pat. No. 7,202,540.

(30) Foreign Application Priority Data

Aug. 30, 2002 (JP) .............................. 2002-256120

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 27/10* (2006.01)
*H01L 29/739* (2006.01)

(52) U.S. Cl. ...................... 257/408; 257/202; 257/327; 257/336; 257/344; 257/390; 257/391; 257/900; 257/E29.012; 257/E29.266; 257/E29.269; 257/E29.278

(58) Field of Classification Search ................. 257/202, 257/327, 336, 344, 408, 390–391, 900, E29.012, 257/E29.266, E29.269, E29.278
See application file for complete search history.

(56) References Cited

U.S. PATENT DOCUMENTS 4,329,186 A  5/1982  Kotecha et al.

(Continued)

FOREIGN PATENT DOCUMENTS

JP  2-219278 A  8/1990

(Continued)

OTHER PUBLICATIONS

Korean Office Action dated Sep. 22, 2006 (issued date), issued in corresponding Korean Patent Application No. 2005-7003251.

(Continued)

*Primary Examiner*—Ida M Soward
(74) *Attorney, Agent, or Firm*—Westerman, Hattori, Daniels & Adrian, LLP

(57) ABSTRACT

A drain (7) includes a lightly-doped shallow impurity region (7a) aligned with a control gate (5), and a heavily-doped deep impurity region (7b) aligned with a sidewall film (8) and doped with impurities at a concentration higher than that of the lightly-doped shallow impurity region (7a). The lightly-doped shallow impurity region (7a) leads to improvement of the short-channel effect and programming efficiency. A drain contact hole forming portion (70) is provided to the heavily-doped impurity region (7b) to reduce the contact resistance at the drain (7).

14 Claims, 12 Drawing Sheets

U.S. PATENT DOCUMENTS

| | | | |
|---|---|---|---|
| 5,079,603 A | | 1/1992 | Komori et al. |
| 5,081,052 A | * | 1/1992 | Kobayashi et al. ........... 438/278 |
| 5,217,910 A | * | 6/1993 | Shimizu et al. ............. 438/231 |
| 5,345,104 A | | 9/1994 | Prall et al. |
| 5,526,303 A | * | 6/1996 | Okajima ..................... 365/154 |
| 5,583,364 A | * | 12/1996 | Nakamura .................. 257/408 |
| 5,612,914 A | * | 3/1997 | Liu et al. ................ 365/185.26 |
| 5,672,529 A | | 9/1997 | Kato et al. |
| 5,705,839 A | | 1/1998 | Hsu et al. |
| 5,710,449 A | * | 1/1998 | Lien et al. .................... 257/336 |
| 5,732,012 A | | 3/1998 | Cappelletti et al. |
| 5,793,086 A | | 8/1998 | Ghio et al. |
| 5,795,807 A | * | 8/1998 | Gardner et al. .............. 438/279 |
| 5,828,104 A | * | 10/1998 | Mizushima .................. 257/344 |
| 5,841,168 A | * | 11/1998 | Gardner et al. .............. 257/344 |
| 5,874,328 A | * | 2/1999 | Liu et al. .................... 438/199 |
| 5,898,202 A | | 4/1999 | Fulford, Jr. et al. |
| 5,907,779 A | * | 5/1999 | Choi .......................... 438/279 |
| 5,981,983 A | * | 11/1999 | Funaki et al. ............... 257/138 |
| 6,030,869 A | | 2/2000 | Odake et al. |
| 6,066,525 A | * | 5/2000 | Liu et al. ..................... 438/241 |
| 6,069,382 A | * | 5/2000 | Rahim ........................ 257/316 |
| 6,069,383 A | * | 5/2000 | Yu ............................... 257/316 |
| 6,114,721 A | * | 9/2000 | Ema ............................ 257/306 |
| 6,121,643 A | * | 9/2000 | Gardner et al. .............. 257/202 |
| 6,274,901 B1 | | 8/2001 | Odake et al. |
| 6,278,160 B1 | | 8/2001 | Park et al. |
| 6,330,187 B1 | | 12/2001 | Choi et al. |
| 6,388,298 B1 | | 5/2002 | Gardner et al. |
| 6,420,225 B1 | * | 7/2002 | Chang et al. ................. 438/237 |
| 6,445,617 B1 | * | 9/2002 | Sakakibara ............ 365/185.22 |
| 6,482,708 B2 | | 11/2002 | Choi et al. |
| 6,483,157 B1 | * | 11/2002 | Gardner et al. .............. 257/408 |
| 6,492,675 B1 | | 12/2002 | Van Buskirk et al. |
| 6,501,140 B2 | | 12/2002 | Honeycutt et al. |
| 6,569,743 B2 | * | 5/2003 | Park et al. .................... 438/306 |
| 6,613,624 B2 | * | 9/2003 | Wurzer ....................... 438/200 |
| 6,656,803 B2 | * | 12/2003 | Chan .......................... 438/284 |
| 6,660,585 B1 | * | 12/2003 | Lee et al. .................... 438/257 |
| 6,828,634 B2 | | 12/2004 | Oshima |
| 6,844,247 B2 | * | 1/2005 | Inaba ......................... 438/482 |
| 2001/0008786 A1 | | 7/2001 | Tsukiji |
| 2001/0013625 A1 | | 8/2001 | Yu |
| 2002/0031891 A1 | * | 3/2002 | Kim .......................... 438/304 |
| 2002/0036316 A1 | | 3/2002 | Fujio et al. |
| 2002/0098652 A1 | | 7/2002 | Mori et al. |

FOREIGN PATENT DOCUMENTS

| | | |
|---|---|---|
| JP | 11-163174 A | 6/1999 |
| JP | 11-317503 A | 11/1999 |
| JP | 2000-196037 A | 7/2000 |
| KR | 1999-017503 | 3/1999 |
| KR | 2000-0032251 | 6/2000 |

OTHER PUBLICATIONS

Japanese Office Action mailed Mar. 16, 2010, issued in corresponding Japanese Application No. 2002-256120 (Partial Translation).

* cited by examiner

<SECTION I—I>

<SECTION II—II>

<SECTION I-I>

<SECTION II-II>

<SECTION I-I>

<SECTION II-II>

<SECTION I-I>

<SECTION II-II>

SEMICONDUCTOR MEMORY DEVICE

This application is a continuation of U.S. application Ser. No. 11/066,567 filed on Feb. 28, 2005 which is a Continuation of International Application No. PCT/JP03/11108 filed on Aug. 29, 2003.

TECHNICAL FIELD

The present invention relates to a semiconductor memory device particularly suitable to apply to a nonvolatile memory with a floating gate, and a manufacturing method thereof.

BACKGROUND ART

The semiconductor memory devices capable of continuously retaining data even if power source is disconnected are widely used in electrical appliances in recent years. The semiconductor memory devices can be classified into a ROM not accepting any program writing, a PROM accepting the program writing while unable to delete programs once written thereinto, an EPROM into which writing is performed electrically and deletion is performed by irradiating ultra-violet ray, and an EEPROM into which both the writing and deletion are performed electrically. A flash memory belongs to the EEPROM, thereby the flash memory can electrically delete all storage data in a core transistor in block.

In the flash memory, writing and deleting operations of charges from a channel section or a source/drain to a floating gate are performed using hot electrons or a Fowler-Nordheim tunneling current. In any of the techniques, voltage application to the floating gate is performed via a control gate on the floating gate. The writing is performed by applying positive voltages to the control gate and relatively low voltages to the drain to thereby store charges from a channel region to the floating gate. Meanwhile, the deletion is performed by applying positive voltages to the source/drain or the channel region using the control gate as a ground to thereby pull out charges from the floating gate. Further, the readout is performed by applying positive voltages to the control gate and relatively low voltages to the drain.

Here, for the semiconductor memory device that includes a flash memory and that its transistor is of the N-type, the source/drain of the core transistor in a memory cell are formed by an ion-implantation of N-type impurities for the drain and by an ion-implantation of N-type impurities at a high concentration after the formation of a source line for the source. Such a formation method is adopted based on the reason described below. In order to improve programming efficiency by generating hot electrons enough required for the writing operation, the drain of the core transistor requires an ion-implantation for example of arsenic with relatively high dose amount ($1 \times 10^{14}/cm^2$ or more) without employing an LDD structure. Meanwhile, however, when the drain is formed by being dosed with impurities at a high concentration, a short-channel effect is concerned about, so that the drain cannot be highly dosed when formed as a source/drain of the transistor used in the general CMOS semiconductor process.

As has been described, when forming the drain in the semiconductor memory device, it is required to perform ion-implantation at a dose amount lower than that for forming the source, causing a problem of higher drain contact resistance. Incidentally and in addition thereto, a PN junction is formed by an ion-implantation of relatively low dose amount, causing another problem that the withstand voltage of the PN junction of the drain is unable to be improved due to a shallow junction by which the transition region of the PN junction is in the vicinity of the substrate surface.

The present invention has been made in view of the above-described problems, and an object thereof is to provide a highly reliable semiconductor memory device and a manufacturing method of the same.

SUMMARY OF THE INVENTION

A semiconductor memory device according to the present invention includes: a semiconductor substrate; a gate insulating film formed on the semiconductor substrate; a gate electrode formed by patterning on the gate insulating film; a pair of diffusion layers formed at both sides of the gate electrode and in a surface layer of the semiconductor substrate; and a pair of sidewall films formed on side surfaces of the gate electrode, in which one diffusion layer of the pair of diffusion layers is formed to be aligned with the gate electrode, and in which other diffusion layer of the pair of diffusion layers is composed of a lightly-doped impurity region formed to be aligned with the gate electrode and doped with impurities at a concentration lower than the concentration of the one diffusion layer, and a heavily-doped impurity region formed to be aligned with the sidewall film and doped with impurities at a concentration higher than the concentration of the lightly-doped impurity region.

A manufacturing method of a semiconductor memory device according to the present invention includes the steps of: forming a gate electrode by patterning on a semiconductor substrate via a gate insulating film; forming one diffusion layer by doping impurities into such a surface layer of the semiconductor substrate that is at one side of the gate electrode; forming a lightly-doped impurity region by doping impurities into such a surface layer of the semiconductor substrate that is at other side of the gate electrode at a concentration lower than the concentration of the other side of the gate electrode; forming a pair of sidewall films on side surfaces of the gate electrode; and forming a heavily-doped impurity region partially overlapping the lightly-doped impurity region by doping a high concentration of impurities into such a surface layer of the semiconductor substrate that is at the other side of the sidewall film as well as the gate electrode to thereby form other diffusion layer composed of the lightly-doped impurity region and the heavily-doped impurity region.

DETAILED DESCRIPTION OF THE PREFERRED EMBODIMENTS

The present invention will be specifically described below by citing embodiments whereas, needless to say, the invention is not limited thereto. The features, characteristics, and various advantages of the present invention will be understood more clearly with the attached drawings and preferred embodiments as will be specifically explained below.

Hereinafter, specific embodiments of a semiconductor memory device and a manufacturing method thereof according to the present invention will be described with reference to the attached drawings.

First Embodiment

First, a first embodiment according to the present invention will be described. In the present embodiment, as a semiconductor memory device, an NOR flash memory will be disclosed.

Figure 1A:
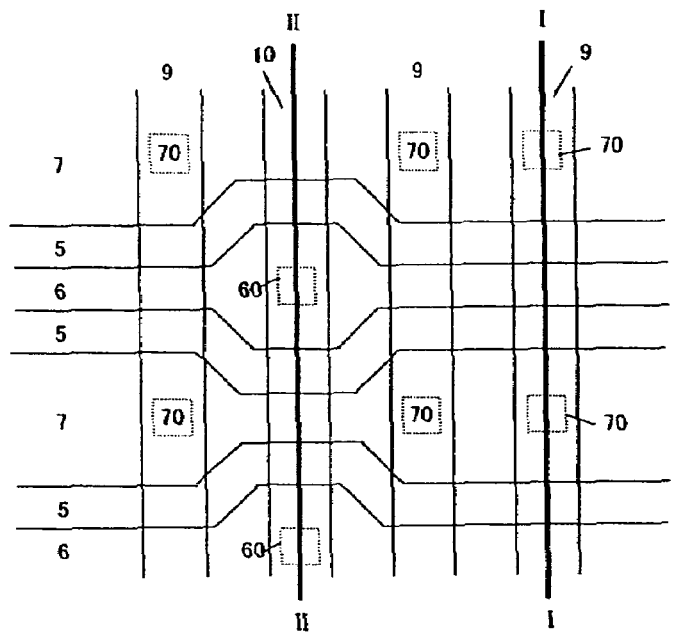
FIGS. 1A to 1C are schematic block diagrams of a semiconductor memory device according to a first embodiment of the present invention.
Figure 1B:
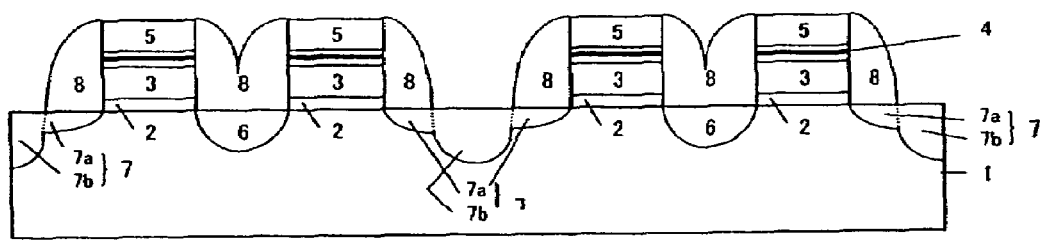
Figure 1C:
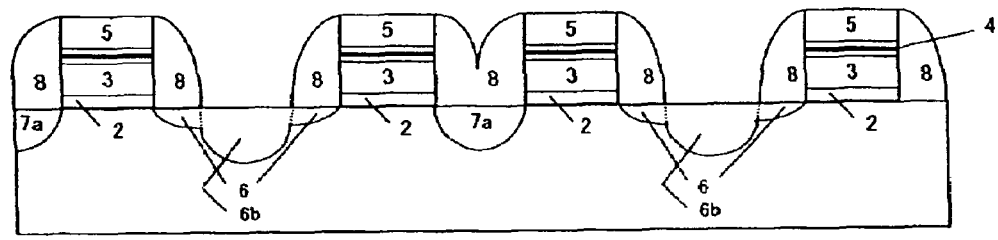

FIGS. 1A to 1C are schematic block diagrams of the flash memory according to the first embodiment of the present invention, in which FIG. 1A is a top plan view of the semiconductor memory device, FIG. 1B is a schematic sectional view taken along the I-I line in FIG. 1A, and FIG. 1C is a schematic sectional view taken along the II-II line in FIG. 1A. Note that, in the present embodiment, the drawings illustrate only memory cell regions of the flash memory, and peripheral circuit regions thereof or the like are omitted in the drawings, for convenience of description.

Main Components of Flash Memory According to the First Embodiment

This flash memory is configured to include a matrix of word lines (control gates) 5 formed in the row direction, bit lines 9 wired in the column direction and connected to drains 7, and floating gates 3 having an island structure at intersections of the word lines 5 and the bit lines 9 under the word lines 5. There are further provided a source line 10 in the column direction to be connected to sources 6 for every predetermined number of bit lines 9.

Between the word lines 5, the sources 6 and the drains 7 are alternately formed, of which the source 6 is provided with a source contact hole forming portion 60 to ground, and the drain 7 is provided with drain contact hole forming portions 70 for every intersections with the bit lines 9 to write.

Between the I-I line through which the bit line 9 is wired, the sources 6 are formed narrowly in width and the drains 7 are formed widely in width, and between the II-II through which the source line 10 is wired, the sources 6 are formed widely in width, and the drains 7 are formed narrowly in width.

Subsequently, description will be given for FIG. 1B showing a section of the bit line 9 (between the I-I line) shown in FIG. 1A.

The flash memory according to the present embodiment includes a semiconductor substrate 1 composed of P-type silicon, source 6 and drain 7 composed of $n^+$ diffusion layers formed in the surface of the semiconductor substrate 1, a first gate insulating film 2 formed on the semiconductor substrate 1, a floating gate 3 having an island structure and formed on the first gate insulating film 2 for every memory cell to store electric charges, a second gate insulating film 4 composed of an ONO film (oxide film/nitrided film/oxide film) formed on the floating gate 3, a control gate 5 formed on the second gate insulating film 4 and composing a word line, a sidewall 8 formed as a protective film on side surfaces of four layers of the first gate insulating film 2, the floating gate 3, the second gate insulating film 4, and the control gate 5.

The drain 7 is composed of a shallow lightly-doped impurity region 7a including impurities at a concentration lower than that of the source 6 and a deep heavily-doped impurity region 7b partially overlapping the lightly-doped impurity region 7a and including impurities at a concentration higher than that of the lightly-doped impurity region 7a. The lightly-doped impurity region 7a is formed to align with the control gate 5, the heavily-doped impurity region 7b is formed to align with the sidewall 8, and the drain contact hole forming portion 70 exists at a predetermined portion on the heavily-doped impurity region 7b.

Further, the sidewall 8 is formed to cover the surface of the source 6 so as to close the surface except the vicinity of the later-described source contact hole forming portion 60, and also to have a shape with an opening to expose a predetermined region on the surface of the drain 7.

Subsequently, description will be given for FIG. 1C showing the section (between the II-II line) of the source line 10 in FIG. 1A.

As for the section of the source line 10, the drain 7 is formed narrowly in width and the source 6 is formed widely in width, so that the drain 7 is closed by the sidewall 8 while the source 6 is formed to have an opening at a predetermined region.

The source 6 is composed mainly of an $n^+$ diffusion layer and includes a heavily-doped impurity regions 6b only in the vicinity of the source contact hole forming portions 60.

Manufacturing Method of Flash Memory According to First Embodiment

Subsequently, a manufacturing method of the flash memory according to the first embodiment will be described.

FIGS. 2A to 4C are schematic sectional views showing the manufacturing method of the flash memory in FIG. 1B in the order of steps.

Figure 2A:
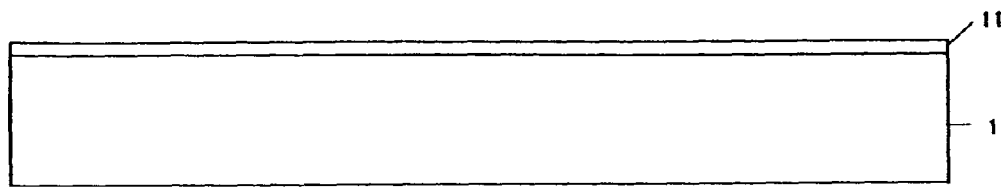
FIGS. 2A to 2D are schematic sectional views showing a manufacturing method of the semiconductor memory device according to the first embodiment shown in FIGS. 1A to 1C in the order of steps.

First, as shown in FIG. 2A, an element active region is defined on the semiconductor substrate 1 composed of P-type silicon for example by forming an element isolation structure (not shown) by LOCOS method or the like, and then the surface of the semiconductor substrate 1 is heated at a high temperature, namely under a temperature condition of 850°

C. to 1050° C. to thereby form a silicon oxide film (SiO₂ film) 11 having a film thickness of 8 nm to 15 nm. Here, the surface of the semiconductor substrate 1 is shown in the drawing as an element active region.

Figure 2B:
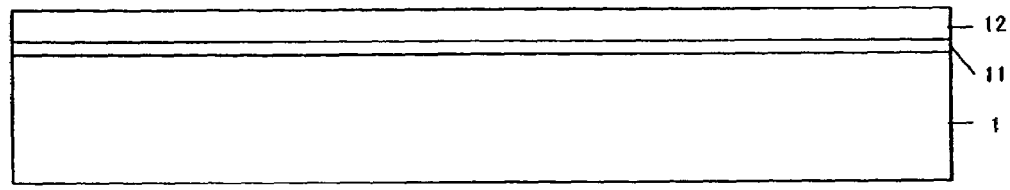

Next, as shown in FIG. 2B, an amorphous silicon (α-Si) 12 doped with phosphorus (P) at an concentration of approximately $0.1 \times 10^{20}/cm^3$ to $3 \times 10^{20}/cm^3$ is deposited by CVD method to have a film thickness of 50 nm to 200 nm. Note that polysilicon may be used as the alternative for the amorphous silicon.

Figure 2C:
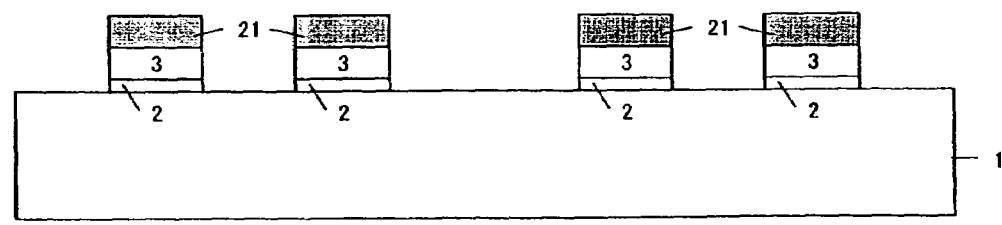

Subsequently, as shown in FIG. 2C, resist patterns 21 are formed by photolithography on the amorphous silicon 12, then dry etching is performed using the resist patterns 21 as masks to form the floating gates 3 composed of the amorphous silicon 12 and a first gate insulating film 2 composed of the silicon oxide film (SiO₂ film) 11.

Figure 2D:
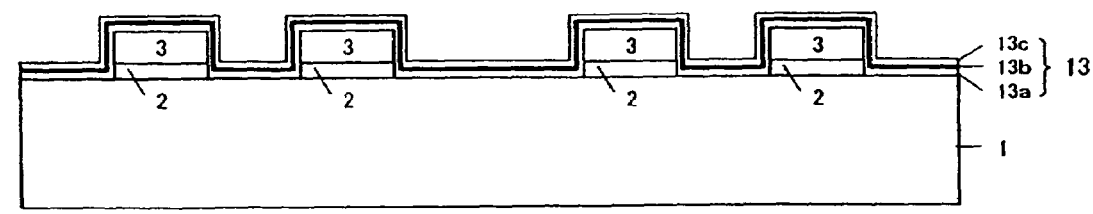

Subsequently, the resist patterns 21 are removed by ashing using O₂ plasma or so forth, and thereafter an ONO film 13 is formed, as shown in FIG. 2D. Specifically, an oxide film 13a of a film thickness of 4 nm to 7 nm is formed by CVD method under a temperature condition of 700° C. to 800° C., thereafter, a nitrided film 13b of a film thickness of 8 nm to 10 nm is formed on the oxide film 13a by CVD method under a temperature condition of 700° C. to 800° C., and an oxide film 13c of a film thickness of 4 nm to 7 nm is formed on the nitrided film 13b by thermal oxidation under a temperature condition of 900° C. to 1000° C. These three films being the ONO film 13 serve as a ferroelectric film between the floating gate 3 and the control gate 5.

Figure 3A:
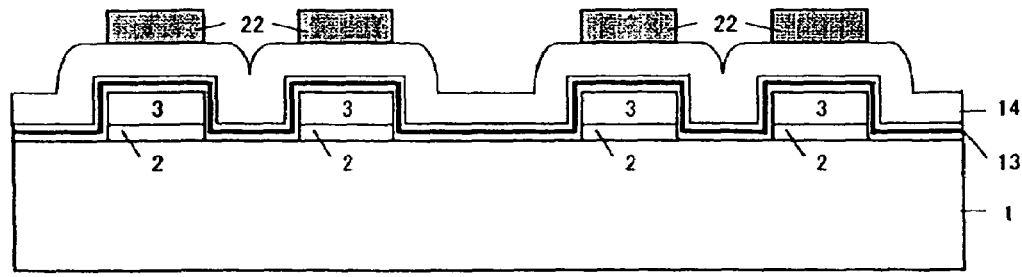
FIGS. 3A to 3D are schematic sectional views showing the manufacturing method of the semiconductor memory device according to the first embodiment shown in FIGS. 1A to 1C in the order of steps following FIG. 2D.

Subsequently, as shown in FIG. 3A, an amorphous silicon or polysilicon 14 doped with phosphorus (P) at a concentration of $2 \times 10^{20}/cm^3$ to $3 \times 10^{21}/cm^3$ is deposited by CVD method to have a film thickness of 100 nm to 300 nm. Further, resist patterns 22 of an electrode shape are formed on the amorphous silicon 14 by photolithography. Here, polysilicon can be used as an alternative for the amorphous silicon.

Figure 3B:
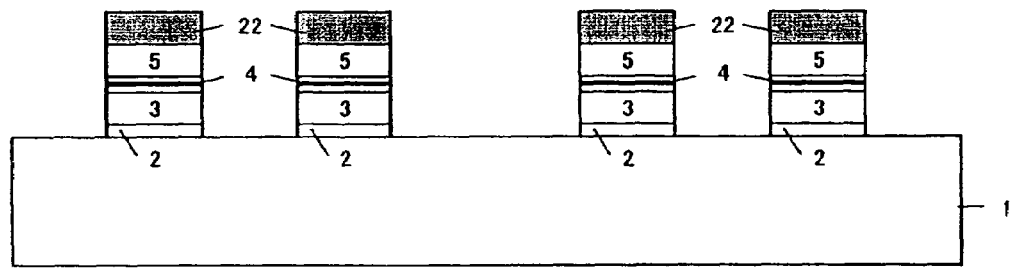

Subsequently, as shown in FIG. 3B, dry etching is performed using the resist patterns 22 as masks to form the control gate 5 formed by the amorphous silicon 14 and the second gate insulating film 4 formed by the ONO film 13.

Figure 3C:
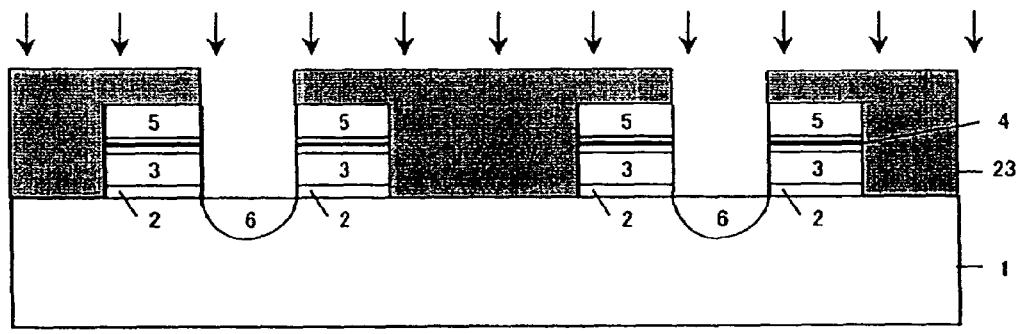

Subsequently, the resist patterns 22 are removed by ashing using O₂ plasma or so forth, and thereafter, as shown in FIG. 3C, there is formed a resist pattern 23 of a shape to expose a surface of the semiconductor substrate 1 at one side of the control gate 5, namely a surface portion the semiconductor substrate 1 to form the source 6. After that, ion-implantation of arsenic (As) is performed using the resist pattern 23 as a mask under the conditions: acceleration energy=20 keV to 60 keV, gradient angle=approximately 0(zero) degrees, and dose amount=$1 \times 10^{15}/cm^2$ to $6 \times 10^{15}/cm^2$, to thereby form the source 6 being an N-type diffusion layer of a core transistor.

Figure 3D:
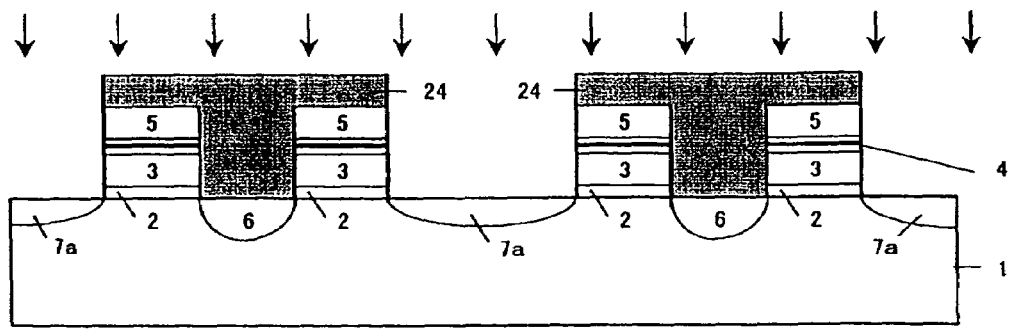

Subsequently, the resist patterns 23 is removed by ashing using O₂ plasma or so forth, and thereafter, as shown in FIG. 3D, there is formed, by photolithography, a resist pattern 24 of a shape to expose a surface of the semiconductor substrate 1 at the other side of the control gate 5, namely a surface portion the semiconductor substrate 1 to form the drain 7. After that, ion-implantation of arsenic (As) is performed using the resist pattern 24 as a mask under the conditions: acceleration energy=20 keV to 60 keV, gradient angle=approximately 0(zero) degrees, and dose amount=$1 \times 10^{15}/cm^2$ to $0.8 \times 10^{15}/cm^2$, to thereby form the shallow lightly-doped impurity region 7a being an N-type diffusion layer doped with impurities at a concentration lower than that of the source 6. As is found also by FIG. 3D, the drain 7 side is the lightly-doped impurity region 7a so that a shallow transition region of PN junction is formed, and the source 6 side is the N-type diffusion layer doped with impurities at a concentration higher than that of the lightly-doped impurity region 7a so that a deep transition region of PN junction is formed.

Figure 4A:
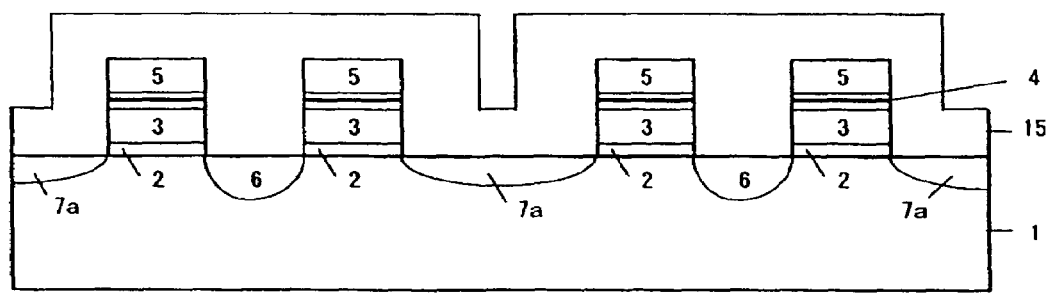
FIGS. 4A to 4C are schematic sectional views showing the manufacturing method of the semiconductor memory device according to the first embodiment shown in FIGS. 1A to 1C in the order of steps following FIG. 3D.

Subsequently, the resist pattern 24 is removed by ashing using O₂ plasma or so forth, and thereafter, as shown in FIG. 4A, a silicon oxide film (TEOS) 15 is deposited over the entire surface by CVD method to have a film thickness of 50 nm to 150 nm. Here, a silicon nitrided film may be used as the alternative for the silicon oxide film.

Figure 4B:
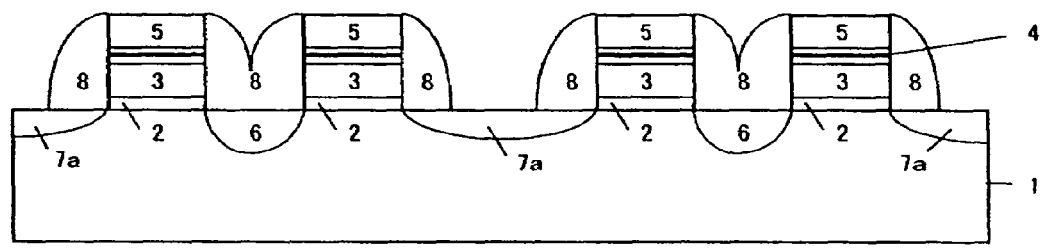

Subsequently, as shown in FIG. 4B, the entire surface of the silicon oxide film 15 is subject to anisotropic etching (etch back) such as reactive ion etching (RIE) so that the sidewalls 8 are formed such that the surface of the source 6 is closed and the surface of the lightly-doped impurity region 7a of the drain 7 is opened, by leaving the silicon oxide film 15 on both the side surfaces of four layers, namely the first gate insulating film 2, the floating gate 3, the second gate insulating film 4, and the control gate 5. In this case, however, at the portion corresponding to the section in FIG. 1C, namely in the vicinity of the source contact hole forming portion 60, the sidewall 8 is formed such that the surface of the drain 7 is closed and the predetermined region on the source 6 is opened.

Figure 4C:
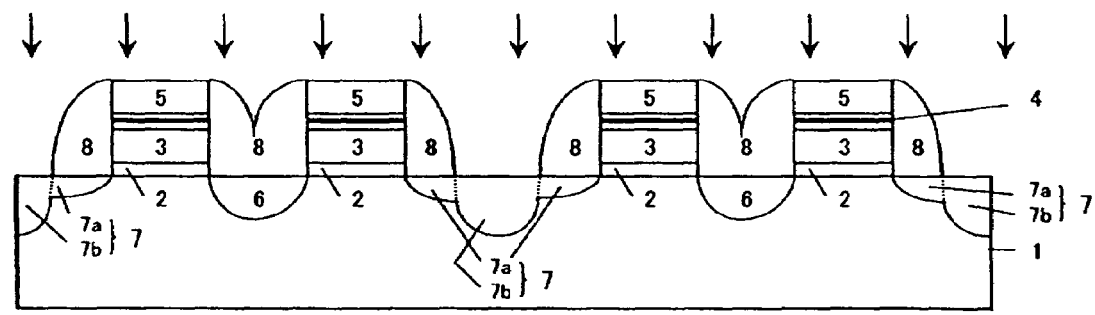

Subsequently, as shown in FIG. 4C, an additional ion-implantation of arsenic (As) is performed over the entire surface under the conditions: acceleration energy=10 keV to 80 keV, gradient angle=approximately 0 (zero) degrees, and dose amount=$1 \times 10^{15}/cm^2$ to $6 \times 10^{15}/cm^2$, to thereby form the heavily-doped impurity region 7b being a deep N-type diffusion layer doped with impurities at a concentration higher than that of the lightly-doped impurity region 7a, in the semiconductor substrate 1 at the other side of the control gate 5 and the sidewall 8. Also, at this time, in the portion corresponding to the section in FIG. 1C, there is formed the heavily-doped impurity region 6b in the source 6 and in a semiconductor substrate 1 at one side of the sidewall 8 as well as the control gate 5. The step of this additional ion-implantation may be performed concurrently with the formation of sources/drains in peripheral circuit regions, allowing the formation of the heavily-doped impurity region 7b without increasing fabricating steps.

After that, an interlayer insulating film (not shown) covering the entire surface is formed, and contact holes are formed in the drain contact hole forming portion 70 of the drain 7 of the interlayer insulating film and the source contact hole forming portion 60 of the source 6 of the same, respectively. Then, the bit line 9 and the source line 10, which are electrically connected with the source 6 and the drain 7 via the source contact hole forming portion 60 and the drain contact hole forming portion 70, are formed to complete the flash memory according to the present embodiment.

According to the present embodiment, the drain 7 is formed by the lightly-doped impurity region 7a and the heavily-doped impurity region 7b with the drain contact hole forming portion 70, so that short-channel effect can be prevented by the lightly-doped impurity region 7a and contact resistance of the drain 7 to the bit line 9 can be reduced by the heavily-doped impurity region 7b.

Further, the drain 7 is designed to have the heavily-doped impurity region 7b, so that the PN junction transition region can be formed deeply from the surface of the semiconductor substrate 1 as compared with the conventional one or so forth that is composed only of the lightly-doped impurity region 7a (refer to the state in FIG. 4B), enabling an improvement of withstand voltage in the PN junction.

Still further, the reduction in contact resistance at the drain 7 and the improvement in withstand voltage in the PN junction can be achieved without increasing steps by performing the additional ion-implantation in FIG. 4C concurrently with the formation of the diffusion layers of the drains/sources in the peripheral circuit region.

Second Embodiment

Subsequently, a second embodiment will be described. In the present embodiment, in the same manner as in the first embodiment, an NOR-type flash memory will be disclosed as a semiconductor memory device whereas the present embodiment differs from the first embodiment in that the drain is formed in a different mode. Note that the same reference numbers will be used for the components and so forth already described in the first embodiment.

According to the present embodiment, a masking is performed over the source contact hole forming portions 60 in FIG. 1A so as not to effect the additional ion-implantation in FIG. 4C thereon, so that a problem of substrate crystal defects or the like ascribable to overdose on the source contact hole forming portion 60 is prevented.

Main Components of Flash Memory According to Second Embodiment

Figure 5A:
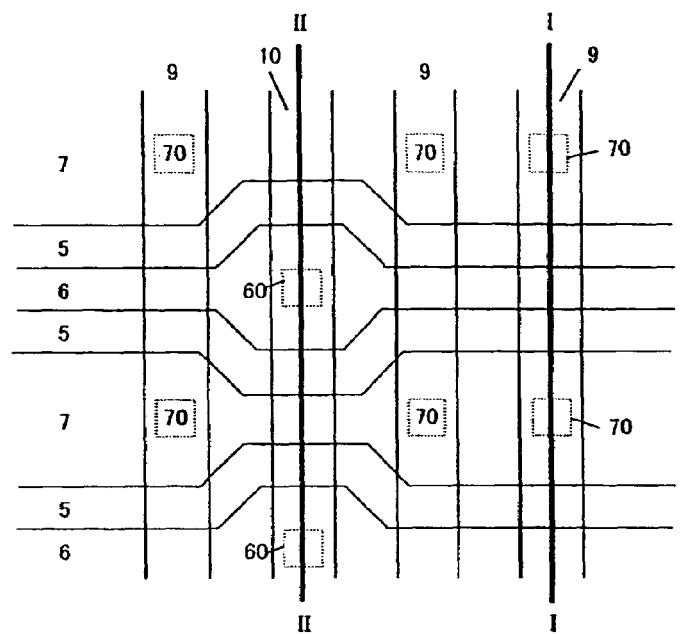
FIGS. 5A to 5C are schematic block diagrams of a semiconductor memory device according to a second embodiment of the present invention.
Figure 5B:
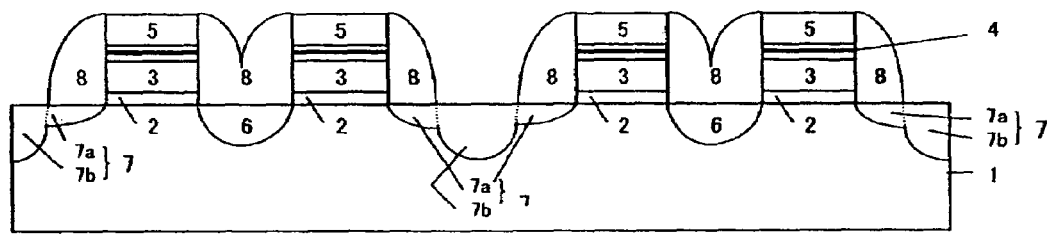
Figure 5C:
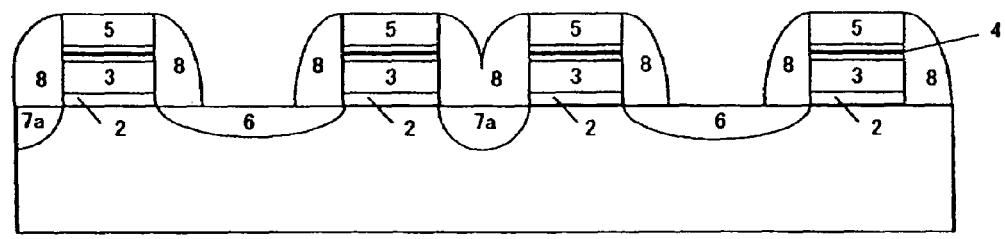

FIGS. 5A to 5C are schematic block diagrams showing the flash memory according to the second embodiment of the present invention, in which FIG. 5A is a top plan view thereof, FIG. 5B is a schematic sectional view taken along the I-I line in FIG. 5A, and FIG. 5C is a schematic sectional view taken along the II-II line in FIG. 5A.

As long as the section taken along the I-I line in FIG. 5A is concerned, the flash memory of the second embodiment is the same as of the first embodiment shown in FIG. 1B, however, as to the section taken along the II-II line in FIG. 5A, the second embodiment differs from the flash memory of the first embodiment shown in FIG. 1C, in that the source 6 is configured not to include the heavily-doped impurity region 6b formed therein. Backed by this, in addition to the effects of the previously-described first embodiment, it is possible to prevent the problem of substrate crystal defects or the like ascribable to the overdose on the source contact hole forming portions 60, enabling further reliable semiconductor memory devices.

Manufacturing Method of Flash Memory According to Second Embodiment

Figure 6A:
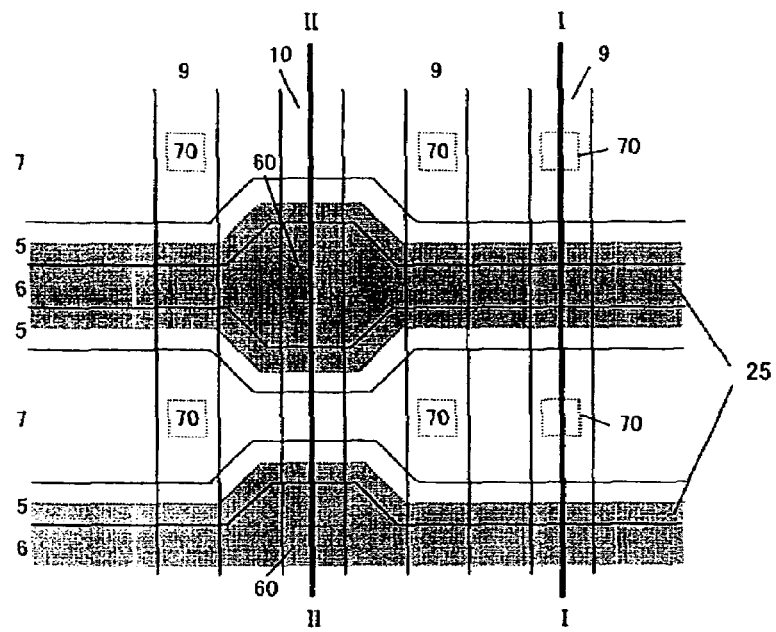
FIGS. 6A to 6C are schematic block diagrams of a first manufacturing method of the semiconductor memory device according to the second embodiment shown in FIGS. 5A to 5C.
Figure 6B:
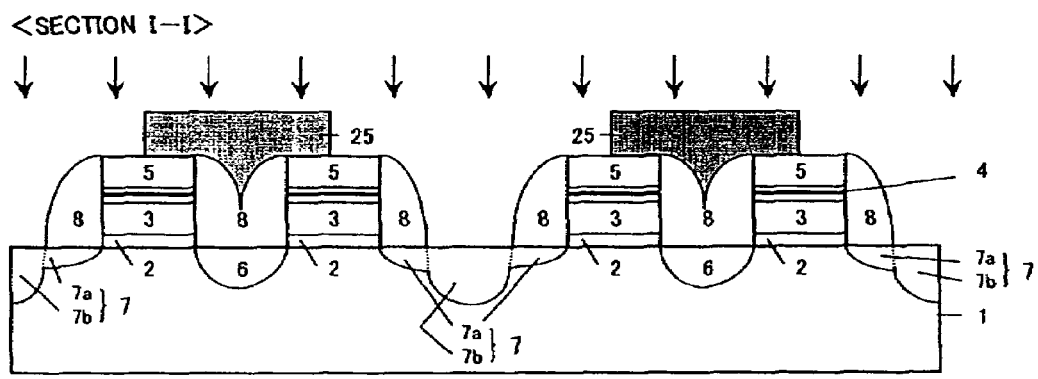
Figure 6C:
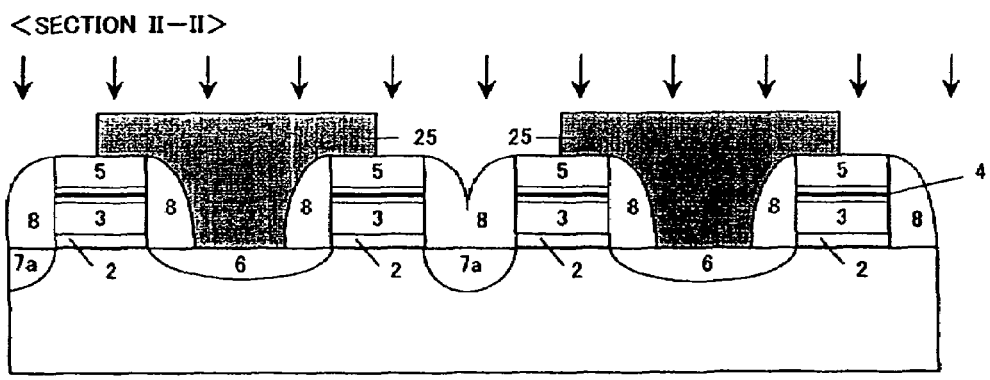

FIGS. 6A to 6C are schematic block diagrams showing a manufacturing method of the flash memory according to the second embodiment, in which FIG. 6A is a top plan view thereof, FIG. 6B is a schematic sectional view taken along the I-I line in FIG. 6A, and FIG. 6C is a schematic sectional view taken along the II-II line in FIG. 6A.

Here, first, the respective steps from FIG. 2A to FIG. 4B are performed.

Next, as shown in FIGS. 6A to 6C, resist patterns 25 is formed. Here, the resist patterns 25 are formed along the control gates 5 so as to entirely mask the portions of the core transistor in which the source 6 are formed. Specifically, as shown in FIG. 6C, the resist pattern 25 is formed into a shape to cover also the surface in the vicinity of the source contact hole forming portion 60 (an opening in the first embodiment). After the formation of the resist pattern 25, an additional ion-implantation of arsenic (As) is performed over the entire surface under the conditions: acceleration energy=10 keV to 80 keV, gradient angle=approximately 0 (zero) degrees, and dose amount=$1\times10^{15}$/cm$^2$ to $6\times10^{15}$/cm$^2$, to thereby form the heavily-doped impurity region 7b being an deep N-type diffusion layer doped with impurities at a concentration higher than that of the lightly-doped impurity region 7a, in the semiconductor substrate 1 at the other side of the sidewall 8 as well as the control gate 5, in the case of the section of the bit line 9 (between I-I) shown in FIG. 6B, in the same manner as in FIG. 4C. Meanwhile, in the case of the section of the source line 10 (between II-II) shown in FIG. 6C, the resist pattern 25 masks over the source 6, so that no additional ion-implantation is performed to thereby form no heavily-doped impurity region 6b as shown in FIG. 1C.

After that, the resist patterns 25 are removed by ashing using O$_2$ plasma or so forth, an interlayer insulating film (not shown) is formed, and contact holes are formed in the drain contact hole forming portion 70 of the drain 7 of the interlayer insulating film and the source contact hole forming portion 60 of the source 6 of the same, respectively.

Then, the bit line 9 and the source line 10, which are electrically connected with the source 6 and the drain 7 via the source contact hole forming portion 60 and the drain contact hole forming portion 70, are formed to complete the flash memory according to the present embodiment.

Now, various modification examples of the second embodiment will be described.

Modification Example 1

Figure 7A:
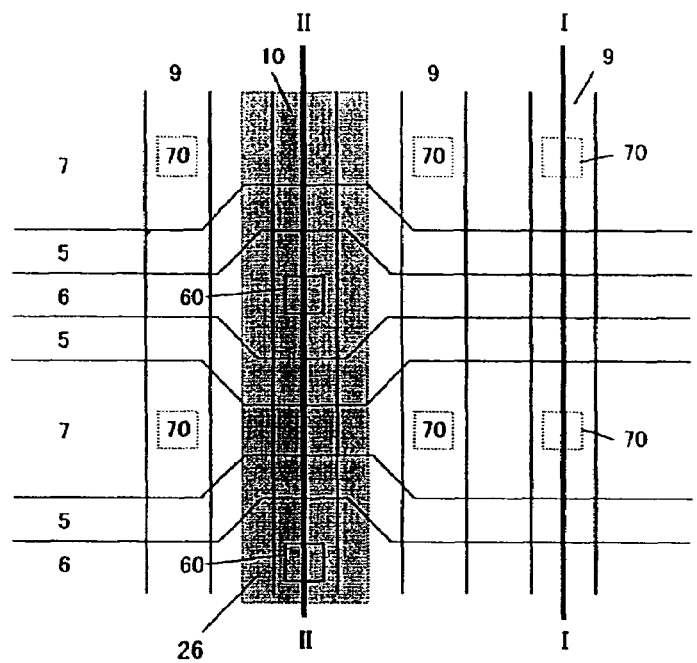
FIGS. 7A to 7C are schematic block diagrams of a manufacturing method of the semiconductor memory device according to a first modification example of the second embodiment shown in FIGS. 5A to 5C.
Figure 7B:
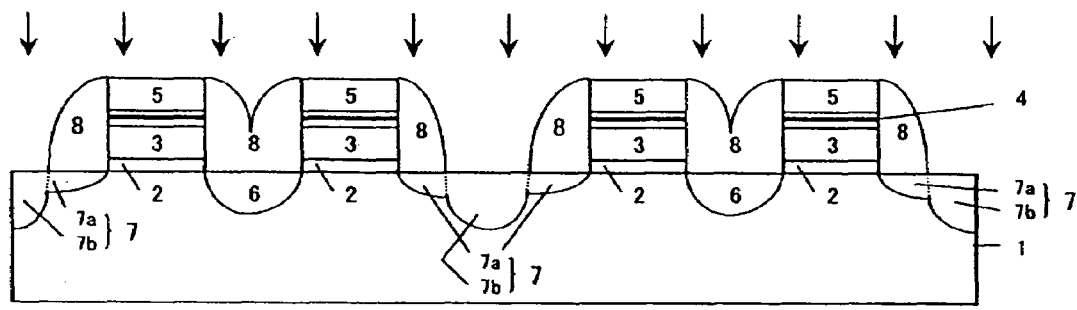
Figure 7C:
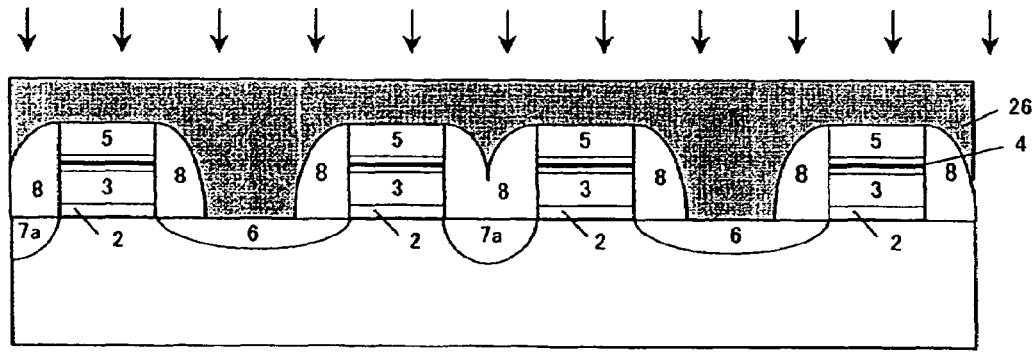

FIGS. 7A to 7C are schematic block diagrams showing a manufacturing method of a flash memory according to a modification example 1 of the second embodiment, in which FIG. 7A is a top plan view thereof, FIG. 7B is a schematic sectional view taken along the I-I line in FIG. 7A, and FIG. 7C is a schematic sectional view taken along the II-II line in FIG. 7A.

In this modification example 1, first, the respective steps shown in FIGS. 2A to 4B are performed.

Subsequently, as shown in the respective drawings from FIGS. 7A to 7C, a resist pattern 26 is formed by photolithography. Here, the resist pattern 26 is formed along and on the source line 10 so as to mask the source contact hole forming portions 60. After the formation of the resist pattern 26, an additional ion-implantation of arsenic (As) is performed over the entire surface under the conditions: acceleration energy=10 keV to 80 keV, gradient angle=approximately 0 (zero) degrees, and dose amount=$1\times10^{15}$/cm$^2$ to $6\times10^{15}$/cm$^2$, to thereby form the heavily-doped impurity region 7b being an deep N-type diffusion layer doped with impurities at a concentration higher than that of the lightly-doped impurity region 7a, in the semiconductor substrate 1 at the other side of the sidewall 8 as well as the control gate 5, in the same manner as in FIG. 4C, in the case of the section of the bit line 9 (between I-I) shown in FIG. 7B. Meanwhile, in the case of the section of the source line 10 (between II-II) shown in FIG. 7C, the resist pattern 26 covers over the source 6, so that no additional ion-implantation is performed to form no heavily-doped impurity region 6b as shown in FIG. 1C.

After that, the resist patterns 26 is removed by ashing using O$_2$ plasma or so forth, an interlayer insulating film (not shown) covering the entire surface is formed, and contact holes are formed in the drain contact hole forming portion 70 of the drain 7 of the interlayer insulating film and the source contact hole forming portion 60 of the source 6 of the same, respectively. Then, the bit line 9 and the source line 10, which are electrically connected with the source 6 and the drain 7 via the source contact hole forming portion 60 and the drain contact hole forming portion 70, are formed to complete the flash memory according to the present embodiment.

For the above-described mask pattern in the second embodiment, a mask of a critical layer using deep ultra violet (DUV) is required on the back of stricter requirements for line width and alignment, whereas the modification example 1 allows a layout of relatively wide patterns (0.4 µm to 1.5 µm) that an I-line aligner can enough handle. Hence, a merit of lowering costs in manufacturing process can be obtained.

Modification Example 2

Figure 8A:
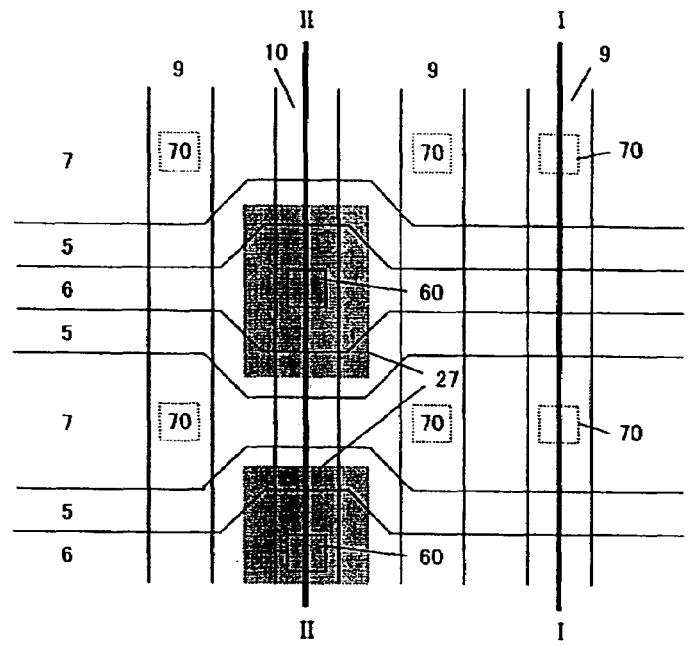
FIGS. 8A to 8C are schematic block diagrams of a manufacturing method of the semiconductor memory device according to a second modification example of the second embodiment shown in FIGS. 5A to 5C.
Figure 8B:
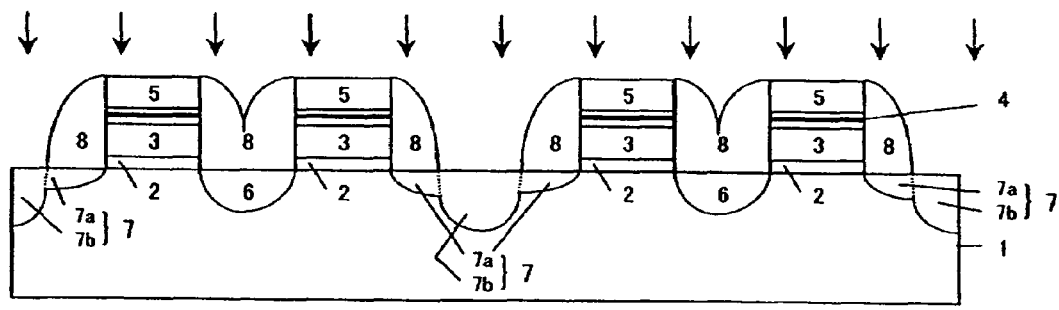
Figure 8C:
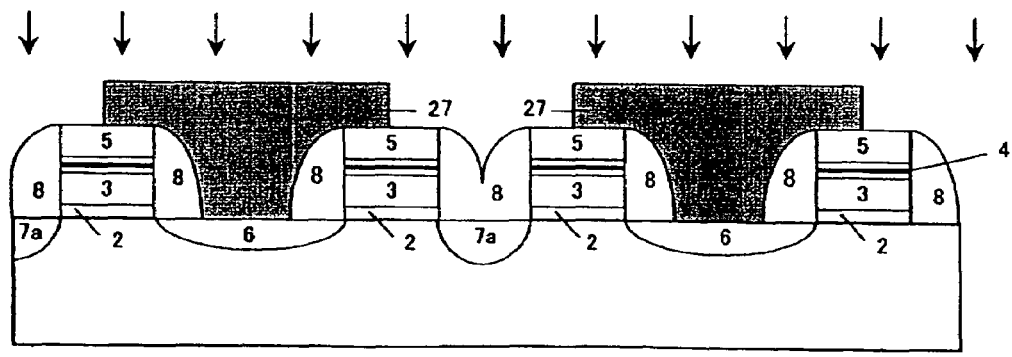

FIGS. 8A to 8C are schematic block diagrams showing a manufacturing method of a flash memory according to a modification example 2 of the second embodiment, in which FIG. 8A is a top plan view thereof, FIG. 8B is a schematic sectional view taken along the I-I line in FIG. 8A, and FIG. 8C is a schematic sectional view taken along the II-II line in FIG. 8.

In a third manufacturing method, first, the respective steps shown in FIGS. 2A to 4B are performed.

Subsequently, as shown in the respective drawings from FIGS. 8A to 8C, resist patterns 27 are formed by photolithography. Here, the resist patterns 27 are formed into a shape masking only the source contact hole forming portions 60. After the formation of the resist patterns 27, an additional ion-implantation of arsenic (As) is performed over the entire surface under the conditions: acceleration energy=10 keV to 80 keV, gradient angle=approximately 0 (zero) degrees, and dose amount=$1\times10^{15}/cm^2$ to $6\times10^{15}/cm^2$, to thereby form the heavily-doped impurity region 7b being an N-type diffusion layer doped with impurities at a concentration higher than that of the lightly-doped impurity region 7a, in the semiconductor substrate 1 at the other side of the sidewall 8 as well as the control gate 5, in the same manner as in FIG. 4C, in the case of the section of the bit line 9 (between I-I) shown in FIG. 8B. Meanwhile, in the case of the section of the source line 10 (between II-II) shown in FIG. 8C, the resist patterns 27 mask over the sources 6, so that no additional ion-implantation is performed to form no heavily-doped impurity region 6b as shown in FIG. 1C.

After that, the resist pattern 27 is removed by ashing using $O_2$ plasma and so forth, an interlayer insulating film (not shown) covering the entire surface is formed, and contact holes are formed in the drain contact hole forming portion 70 of the drain 7 of the interlayer insulating film and the source contact hole forming portion 60 of the source 6 of the same, respectively. Then, the bit line 9 and the source line 10, which are electrically connected with the source 6 and the drain 7 via the source contact hole forming portion 60 and the drain contact hole forming portion 70, are formed to complete the flash memory according to the present embodiment.

For the above-described mask pattern in the second embodiment, a mask of a critical layer using deep ultra violet (DUV) is required on the back of stricter requirements for line width and alignment, whereas the modification example 2 allows a layout of relatively wide patterns (0.4 µm to 1.5 µm) that an I-line aligner can enough handle. Hence, a merit of lowering costs in manufacturing process can be obtained.

Subsequently, the verification results of the characteristics of the flash memories shown in FIGS. 9 to 11 will be described. The results are those verifying the characteristics of the flash memories after the heavily-doped impurity region 7b has been formed in the drain 7 by the additional ion-implantation in the step shown in FIG. 4C. The flash memories verified are "X", "Y", and "X", in which "X" represents the flash memory shown in FIG. 4B into which the additional ion-implantation is not performed, "Y" represents that shown in FIGS. 1A to 1C into which the additional ion-implantation is performed, and "Z" represents that shown in FIGS. 5A to 5C into which the additional ion-implantation is performed.

Figure 9:
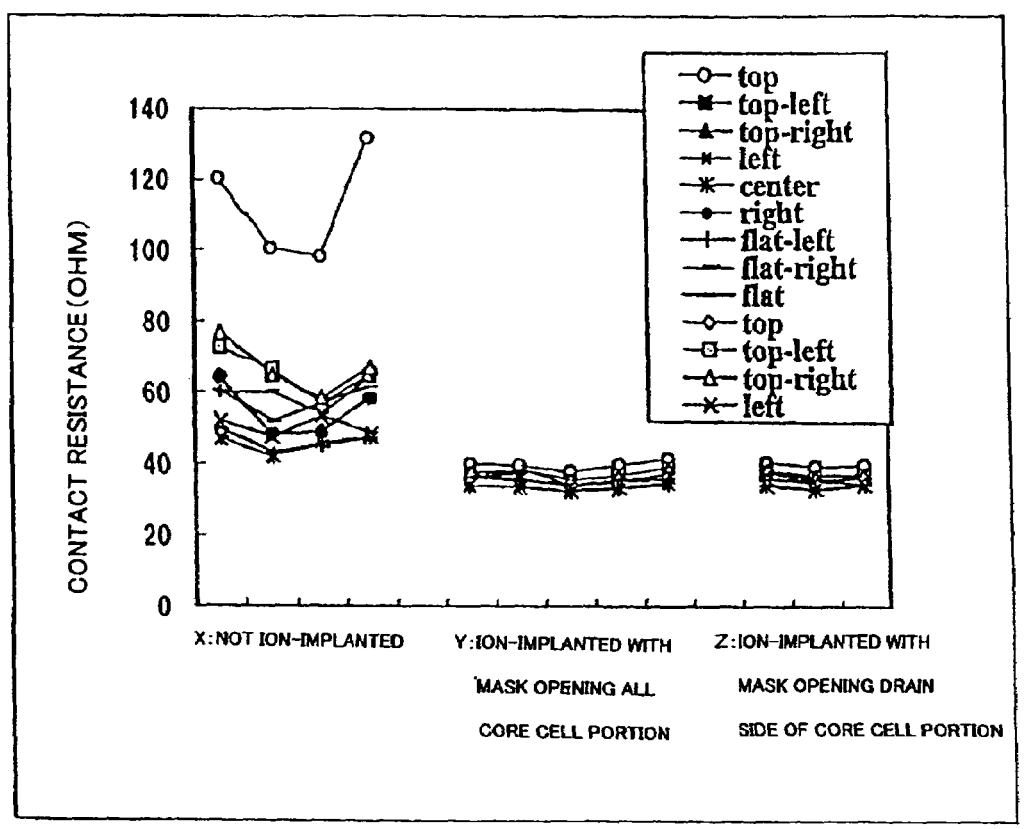
FIG. 9 is a characteristic view of contact resistance at drains of a semiconductor memory device.

FIG. 9 is a characteristic chart showing the contact resistances at the drain 7 of the respective flash memories (X, Y, Z). In FIG. 9, measurements were made at respective points for a peace of semiconductor wafer having the corresponding flash memories formed therein, in which the horizontal axis indicates the number of the peaces of semiconductor wafers measured.

As shown in FIG. 9, it is found that the contact resistances of the flash memories X and Y are extremely low and the resistance values thereof are stable as compared to the contact resistance values of the flash memories X. Backed by this, it is verified that a contact portion is improved in reliability with the formation of the heavily-doped impurity region 7b in the drain contact hole forming portion 70 by the additional ion-implantation in the step in FIG. 4C.

Figure 10:
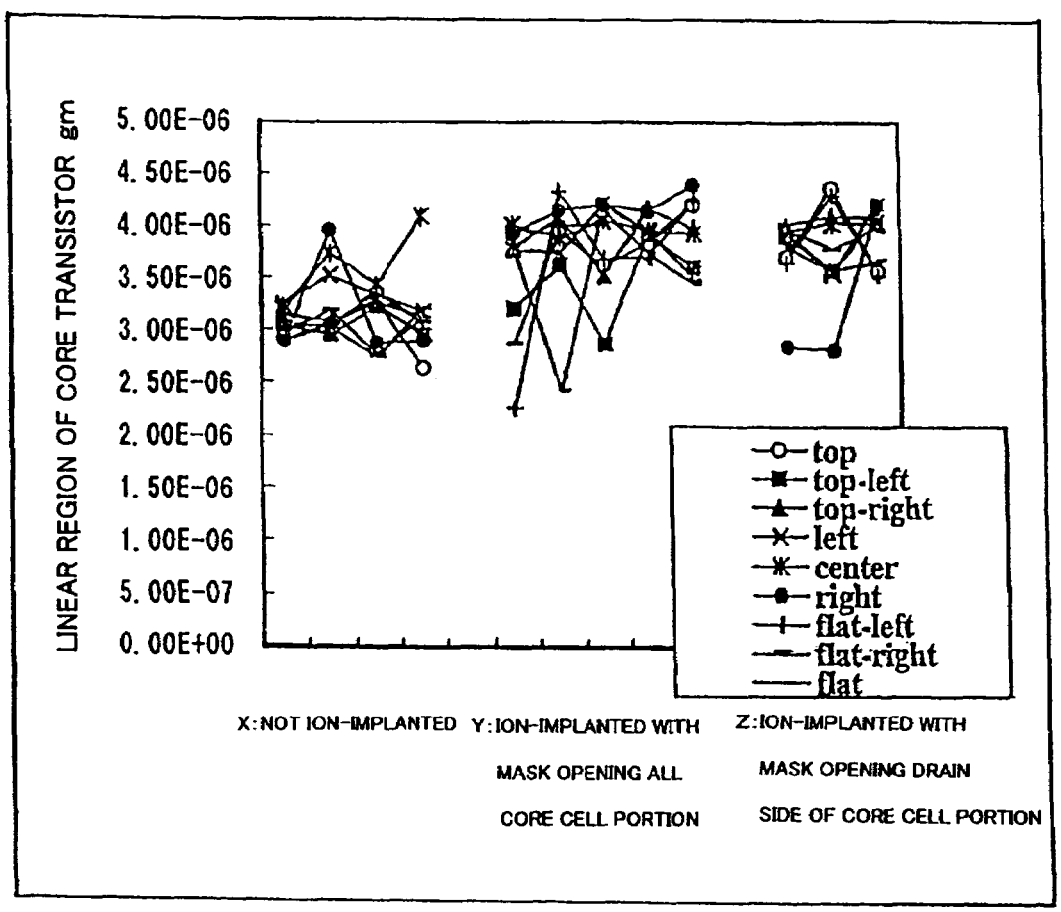
FIG. 10 is a characteristic view of transconductance gm at a core transistor of a semiconductor memory device.

FIG. 10 is a characteristic chart showing transconductances gm of the core transistors in the respective flash memories (X, Y, Z). In FIG. 10, measurements were made at the respective points for a peace of semiconductor device, in which the horizontal axis indicates the number of the peaces of semiconductor devices measured.

As shown in FIG. 10, the values of the transconductances gm of the flash memories Y and Z are high as compared to those of the flash memories X, proving an improvement in the characteristic. Based on this, it is verified that the flash memories are improved in reliability with the formation of the heavily-doped impurity region 7b in the drain 7.

Figure 11:
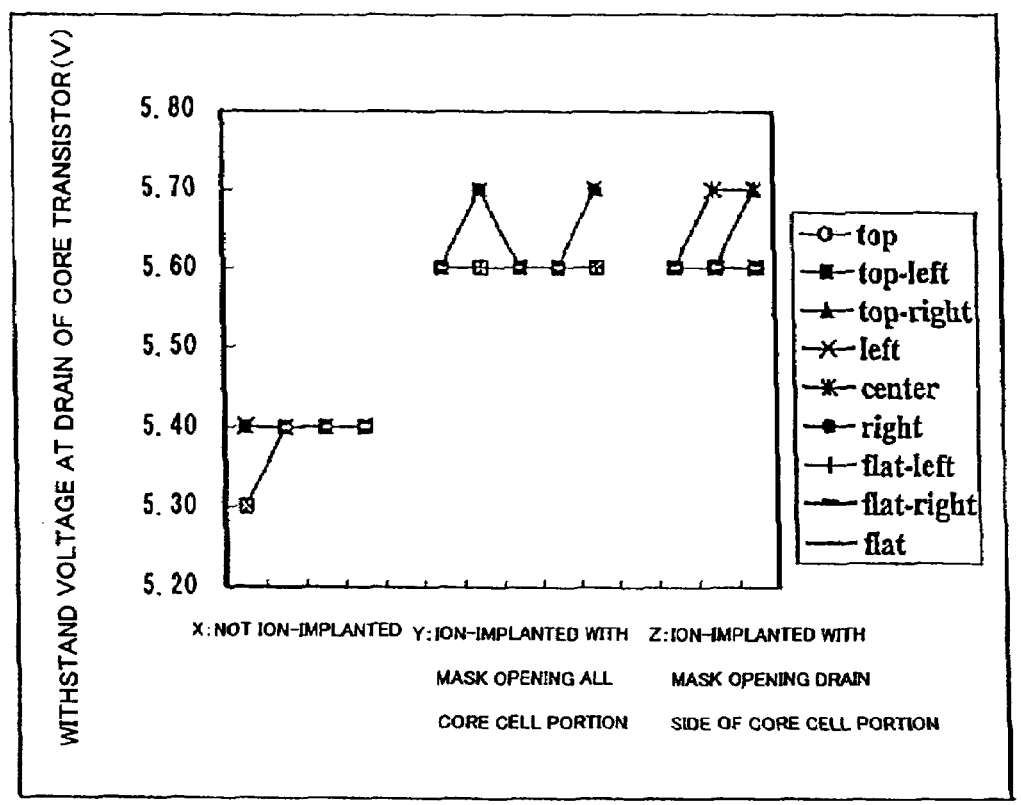
FIG. 11 is a characteristic view of withstand voltage at junctions in drains of a semiconductor memory device.

FIG. 11 is a characteristic chart showing withstand voltages at junctions in drain 7. In FIG. 11, measurements were made at the respective points in a piece of semiconductor wafer in which the flash memories are formed, in which the horizontal axis indicates the number of the peaces of semiconductor wafers measured.

As shown in FIG. 11, the withstand voltages at the junctions of the flash memories Y and Z are extremely improved as compared to the withstand voltages at junctions of the flash memories X. Based on this, it is verified that the withstand voltage at the junction of the drain 7 is improved with the formation of the heavily-doped impurity region 7b deeply from the surface of the semiconductor substrate 1 by the additional ion-implantation in the step in FIG. 4C.

Third Embodiment

As a semiconductor memory device applying the present invention, embodiments applying an NOR-type flash memory have been presented, however, as a third embodiment according to the present invention, the present invention applies to a so-called MONOS type semiconductor memory device being a semiconductor memory device composed of an nitrided film of a charge storage-type having no floating gate, which is structured to have three layers of a semiconductor substrate (silicon substrate), an ONO film, and a gate electrode (polycrystalline silicon film). Note that it is also applicable to semiconductor memory devices of a so-called SONOS structure being the semiconductor memory devices of an embedded bit-line type having a source/drain also usable as a bit line and a channel in parallel with a word line (gate electrode).

Figure 12A:
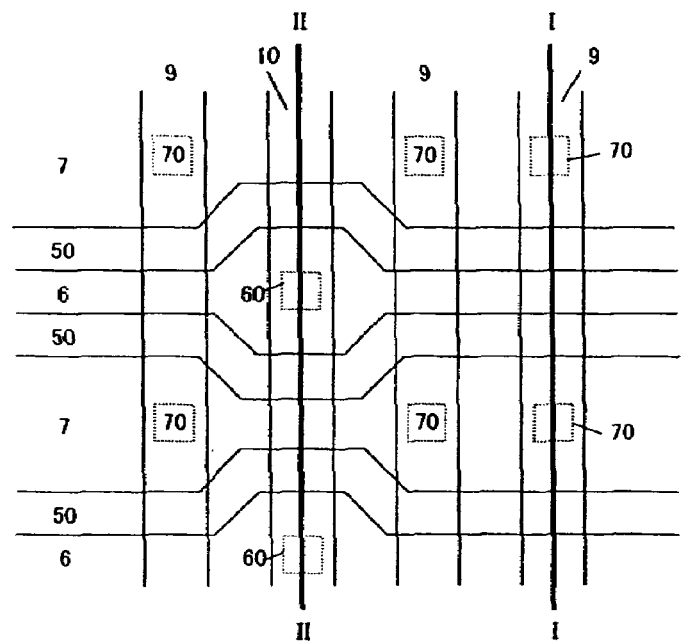
FIGS. 12A to 12C are schematic block diagrams of a semiconductor memory device according to a third embodiment of the present invention.
Figure 12B:
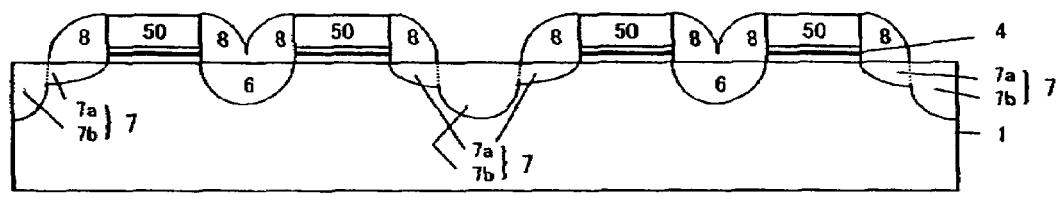
Figure 12C:
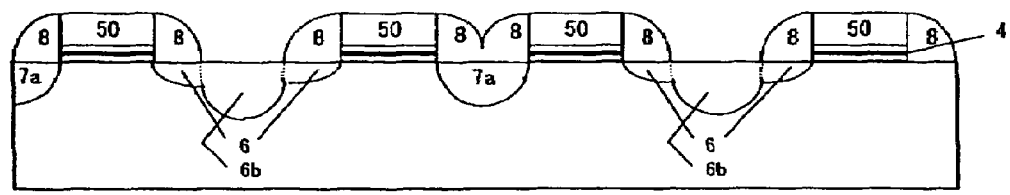

FIGS. 12A to 12C are schematic block diagrams of a semiconductor memory device of a MONOS type showing the third embodiment of the present invention, in which FIG. 12A is a top plan view thereof, FIG. 12B is a schematic sectional view showing a section taken along the I-I line in FIG. 12A, and FIG. 12C is a schematic sectional view showing a section taken along the II-II line in FIG. 12A.

The description will be given as to FIG. 12B showing the section of the bit line 9 (between I-I) shown in FIG. 12A. As shown in FIG. 12B, the semiconductor memory device of the MONOS type includes a semiconductor substrate 1 composed of p-type silicon, a source 6 and a drain 7 formed by n$^+$ diffusion layers and formed in the surface of the semiconductor substrate 1, a gate insulating film 4 formed by an ONO film, a gate electrode 50 formed on the gate insulating film 4 and serving as a word line, and sidewalls 8 formed as protective films on the side surfaces of the two layers of the gate insulating film 4 and the gate electrode 50.

The drain 7 is composed of a shallow lightly-doped impurity region 7a doped with impurities at a concentration lower than that of the n$^+$ diffusion layer of the source 6, and a deep heavily-doped impurity region 7b doped with impurities at a concentration higher than that of the lightly-doped impurity region 7a. The heavily-doped impurity region 7b is formed on the surface layer of the semiconductor substrate 1 using the sidewall 8 as a mask so as to align with the sidewall 8, and there exists a drain contact hole forming portion 70 on the heavily-doped impurity region 7b.

Further, the sidewalls 8 are configured to close the surface of the source 6 and to open a predetermined region of the drain 7.

Subsequently, the description will be given for FIG. 1C showing the section (between II-II) of the source line 10 shown in FIG. 12A. As shown in FIG. 12C, as to the section of the source line 10, the drain 7 is formed narrowly in width and the source 6 is formed widely in width, thereby the surface of the drain 7 is closed by the sidewalls 8 while a predetermined region on the source 6 is opened.

The source 6 is composed of the n$^+$ diffusion layer 6 and the heavily-doped impurity regions 6b formed when the heavily-doped impurity region 7b is formed. The heavily-doped impurity regions 6b is formed in the semiconductor substrate 1 at one side of the gate electrode 50 and the sidewall 8, in which a source contact hole forming portion 60 exists on the heavily-doped impurity regions 6b. Alternatively, it is possible to configure such that the surface of the source contact hole forming portion 60 is masked to prevent the heavily-doped impurity region 6b from being formed by an additional ion-implantation, in order to prevent the problem of substrate crystal defects or the like ascribable to overdose in the source contact hole forming portion 60.

INDUSTRIAL APPLICABILITY

According to the present invention, a highly reliable semiconductor memory device, in which withstand voltage at a drain is improved while satisfying two conflicting requirements of improving programming efficiency by improving short-channel effect and of reducing contact resistance at the drain, can be realized.

What is claimed is:

1. A semiconductor memory device comprising:
   a semiconductor substrate;
   a gate insulating film formed on said semiconductor substrate;
   a plurality of gate electrodes formed on said gate insulating film;
   a pair of diffusion layers formed at both sides of at least one of the plurality of the gate electrodes and in a surface layer of said semiconductor substrate; and
   a pair of sidewall films formed on side surfaces of each of the plurality of the gate electrodes,
   wherein said pair of diffusion layers has one diffusion layer and the other diffusion layer;
   the one diffusion layer is composed of a single diffusion layer formed to be aligned with at least one of the plurality of the gate electrodes at a depth from the surface of said semiconductor substrate,
   the other diffusion layer includes a first doped impurity region formed to be aligned with at least one of the plurality of the gate electrodes and having a first depth from the surface of said semiconductor substrate,
   and a second doped impurity region formed to be aligned with said sidewall film and having a second depth from the surface of said semiconductor substrate which is deeper than the first depth,
   wherein the second doped impurity region is provided between the sidewall film of at least one of the plurality of the gate electrodes and sidewall film of the other of the plurality of the gate electrodes.

2. The semiconductor memory device according to claim 1, wherein a contact hole is provided in said second doped impurity region.

3. The semiconductor memory device according to claim 1, wherein said sidewall film covers the surface of said one diffusion layer.

4. The semiconductor memory device according to claim 1, wherein the first doped impurity region has a first impurity concentration and the second doped impurity region has a second impurity concentration to be different from the first impurity concentration.

5. The semiconductor memory device according to claim 1, wherein the gate electrode includes at least one of a control gate and a floating gate.

6. The semiconductor memory device according to claim 1, wherein the gate insulating film includes an ONO film.

7. The semiconductor memory device according to claim 1, wherein said gate electrode includes a control gate as a word line and a bit line is provided orthogonally.

8. The semiconductor memory device according to claim 1, wherein the semiconductor memory device is a flash memory.

9. The semiconductor memory device according to claim 1, wherein one diffusion layer of said pair of diffusion layers is, in whole, covered by the sidewall film of at least one of the plurality of the gate electrodes and the sidewall film of another gate electrode from the plurality of the gate electrodes.

10. A semiconductor memory device comprising:
    a semiconductor substrate;
    a gate insulating film formed above said semiconductor substrate;
    a plurality of gate electrodes formed by patterning above said gate insulating film;
    a pair of diffusion layers formed at both sides of at least one of the plurality of the gate electrodes and in said semiconductor substrate; and
    a pair of sidewall films formed on side surfaces of each of the plurality of the gate electrodes,
    wherein one diffusion layer of said pair of diffusion layers is formed to be aligned with at least one of the plurality of the gate electrodes,
    wherein other diffusion layer of said pair of diffusion layers includes a first doped impurity region formed to be aligned with at least one of the plurality of the gate electrodes and a second doped impurity region formed to be aligned with said sidewall film, the first doped impurity region is adjacent to the second doped impurity region, wherein the second doped impurity region is provided between the sidewall film of at least one of the plurality of the gate electrodes and the sidewall film of the other of the plurality of the gate electrodes, wherein the first doped impurity region is provided under the sidewall films, wherein the one diffusion layer is a drain and the other diffusion layer is a source and a width of the source is wider than that of the drain at a region where a source contact hole is provided, and wherein the impurity concentration of the first doped impurity region is lower than that of the one diffusion layer.

11. A semiconductor memory device comprising:

a semiconductor substrate;

a gate insulating film formed above said semiconductor substrate;

a plurality of gate electrodes formed by patterning above said gate insulating film;

a pair of diffusion layers formed at both sides of at least one of the plurality of the gate electrodes and in said semiconductor substrate; and a pair of sidewall films formed on side surfaces of each of the plurality of the gate electrodes, wherein one diffusion layer of said pair of diffusion layers is formed to be aligned with at least one of the plurality of the gate electrodes, wherein other diffusion layer of said pair of diffusion layers includes a first doped impurity region formed to be aligned with at least one of the plurality of the gate electrodes and a second doped impurity region formed to be aligned with said sidewall film, the first doped impurity region is adjacent to the second doped impurity region, wherein the second doped impurity region is provided between the sidewall film of at least one of the plurality of the gate electrodes and the sidewall film of the other of the plurality of the gate electrodes, wherein the first doped impurity region is provided under the sidewall films, and wherein a contact hole is provided in the second doped impurity region and in a region having a wide space formed by bending at least two word lines.

12. A semiconductor memory device comprising:

a semiconductor substrate;

a gate insulating film formed on said semiconductor substrate;

a plurality of gate electrodes formed on said gate insulating film;

a pair of diffusion layers formed at both sides of at least one of the plurality of gate electrodes and in a surface layer of said semiconductor substrate; and a pair of sidewall films formed on side surfaces of each of the plurality of gate electrodes, wherein said pair of diffusion layers has one diffusion layer and the other diffusion layer;

the one diffusion layer is composed of a single diffusion layer formed to be aligned with at least one of the plurality of the gate electrodes at a depth from the surface of said semiconductor substrate, the other diffusion layer includes a first doped impurity region formed to be aligned with at least one of the plurality of the gate electrodes and having a first depth from the surface of said semiconductor substrate, and a second doped impurity region formed to be aligned with said sidewall film and having a second depth from the said semiconductor substrate which is deeper than the first depth, wherein one diffusion layer of said pair of diffusion layers is, in whole, covered by the side wall of at least one of the plurality of the gate electrodes and the side wall of the other of the plurality of the gate electrodes, wherein the impurity concentration of the first doped impurity region is lower than that of the one diffusion layer.

13. A semiconductor memory device comprising:

a semiconductor substrate;

a gate insulating film formed on said semiconductor substrate;

a plurality of gate electrodes formed on said gate insulating film;

a pair of diffusion layers formed at both sides of at least one of the plurality of the gate electrodes and in a surface layer of said semiconductor substrate; and a pair of sidewall films formed on side surfaces of each of the plurality of the gate electrodes, wherein said pair of diffusion layers has one diffusion layer and the other diffusion layer;

the one diffusion layer includes a diffusion layer formed to be aligned with at least one of the plurality of the gate electrodes at a depth from the surface of said semiconductor substrate, but has no diffusion layer formed to be self-aligned with said sidewall film, the other diffusion layer includes a first doped impurity region formed to be aligned with at least one of the plurality of the gate electrodes and having a first depth from the surface of said semiconductor substrate, and a second doped impurity region formed to be self-aligned with said sidewall film and having a second depth from the surface of said semiconductor substrate which is deeper than the first depth, wherein the second doped impurity region is provided between the sidewall film of at least one of the plurality of the gate electrodes and the sidewall film of the other of the plurality of the gate electrodes.

14. The semiconductor memory device according to claim 13, wherein the impurity concentration of the first doped impurity region is lower than that of the one diffusion layer.

* * * * *

UNITED STATES PATENT AND TRADEMARK OFFICE
CERTIFICATE OF CORRECTION

PATENT NO. : 7,759,745 B2 Page 1 of 1
APPLICATION NO. : 11/656437
DATED : July 20, 2010
INVENTOR(S) : Hideki Komori et al.

It is certified that error appears in the above-identified patent and that said Letters Patent is hereby corrected as shown below:

On the cover page, item 63;
Change

"Related US Application Data

(63) Continuation of application No. 11/066,567, filed on Feb. 28, 2005, now Pat. No. 7,202,540."

To be

--Related U.S Application Data

(63) Continuation of application No. 11/066,567, filed on Feb. 28, 2005, now Pat. No. 7,202,540. Which is a continuation of International Application No. PCT/JP03/11108 Filed on August 29, 2003.--

Signed and Sealed this

Twenty-third Day of November, 2010

David J. Kappos
*Director of the United States Patent and Trademark Office*